(12) United States Patent
Hsieh (10) Patent No.: US 8,072,000 B2
(45) Date of Patent: Dec. 6, 2011

(54) AVALANCHE CAPABILITY IMPROVEMENT IN POWER SEMICONDUCTOR DEVICES HAVING DUMMY CELLS AROUND EDGE OF ACTIVE AREA

(75) Inventor: Fu-Yuan Hsieh, Kaohsiung (TW)

(73) Assignee: Force Mos Technology Co., Ltd. (TW)

( * ) Notice: Subject to any disclaimer, the term of this patent is extended or adjusted under 35 U.S.C. 154(b) by 265 days.

(21) Appl. No.: 12/453,086

(22) Filed: Apr. 29, 2009

(65) Prior Publication Data

US 2010/0276728 A1 Nov. 4, 2010

(51) Int. Cl.
*H01L 29/74* (2006.01)
*H01L 31/111* (2006.01)

(52) U.S. Cl. .................. 257/139; 257/330; 438/401

(58) Field of Classification Search .............. 257/139, 257/330, E29.262, E29.198; 438/401, 454
See application file for complete search history.

(56) References Cited

U.S. PATENT DOCUMENTS

| 5,877,528 | A  | * | 3/1999 | So ................................ 257/341 |
| 2006/0273385 | A1 | | 12/2006 | Hshieh |
| 2008/0035988 | A1 | * | 2/2008 | Hshieh .......................... 257/330 |
| 2009/0066404 | A1 | * | 3/2009 | Heppenstall et al. ......... 327/513 |
| 2009/0250770 | A1 | * | 10/2009 | Su et al. ........................ 257/401 |
| 2010/0163979 | A1 | * | 7/2010 | Hebert .......................... 257/335 |

* cited by examiner

*Primary Examiner* — Phuc Dang
(74) *Attorney, Agent, or Firm* — Bacon & Thomas, PLLC (57) ABSTRACT

A structure of power semiconductor device having dummy cells around edge of active area is disclosed. The UIS test result of said improved structure shows that failed site after UIS test randomly located in active area which means avalanche capability of the semiconductor power device is enhanced by implementation of the dummy cells.

5 Claims, 15 Drawing Sheets

AVALANCHE CAPABILITY IMPROVEMENT IN POWER SEMICONDUCTOR DEVICES HAVING DUMMY CELLS AROUND EDGE OF ACTIVE AREA

FIELD OF THE INVENTION

This invention relates generally to the cell structure and device configuration of semiconductor devices. More particularly, this invention relates to an improved device configuration with dummy cells around edge of active area to enhance the avalanche capability of semiconductor devices.

BACKGROUND OF THE INVENTION

The unclamped inductive switching test (UIS test) is used to evaluate avalanche capability of a semiconductor power device by measuring UIS current at breakdown voltage. Yet, failed site after UIS test always occur near edge of active area of semiconductor power device of prior art, as shown in FIG. 1A to FIG. 1C.

Figure 1A:
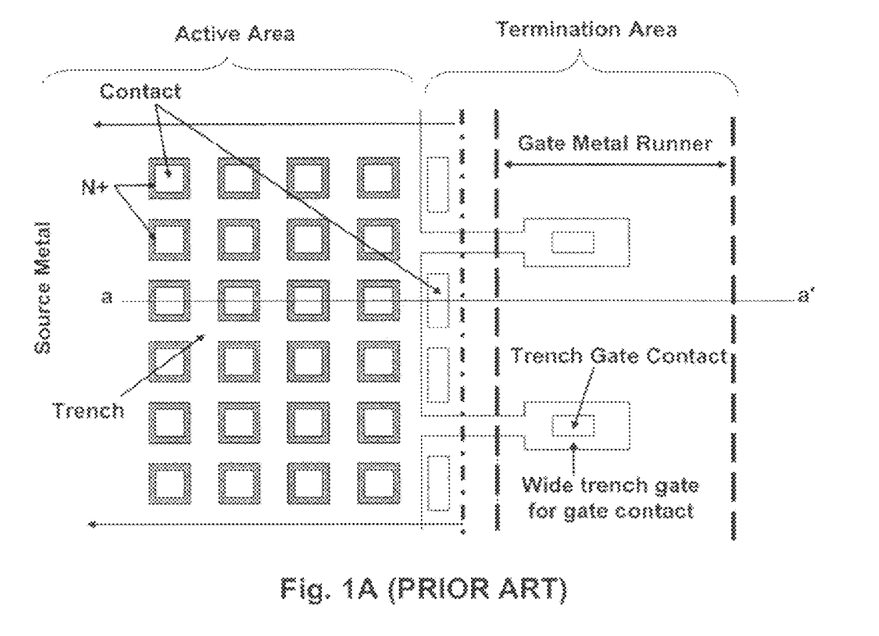
FIG. 1A is a top view of a trench MOSFET of prior art.
Figure 1B:
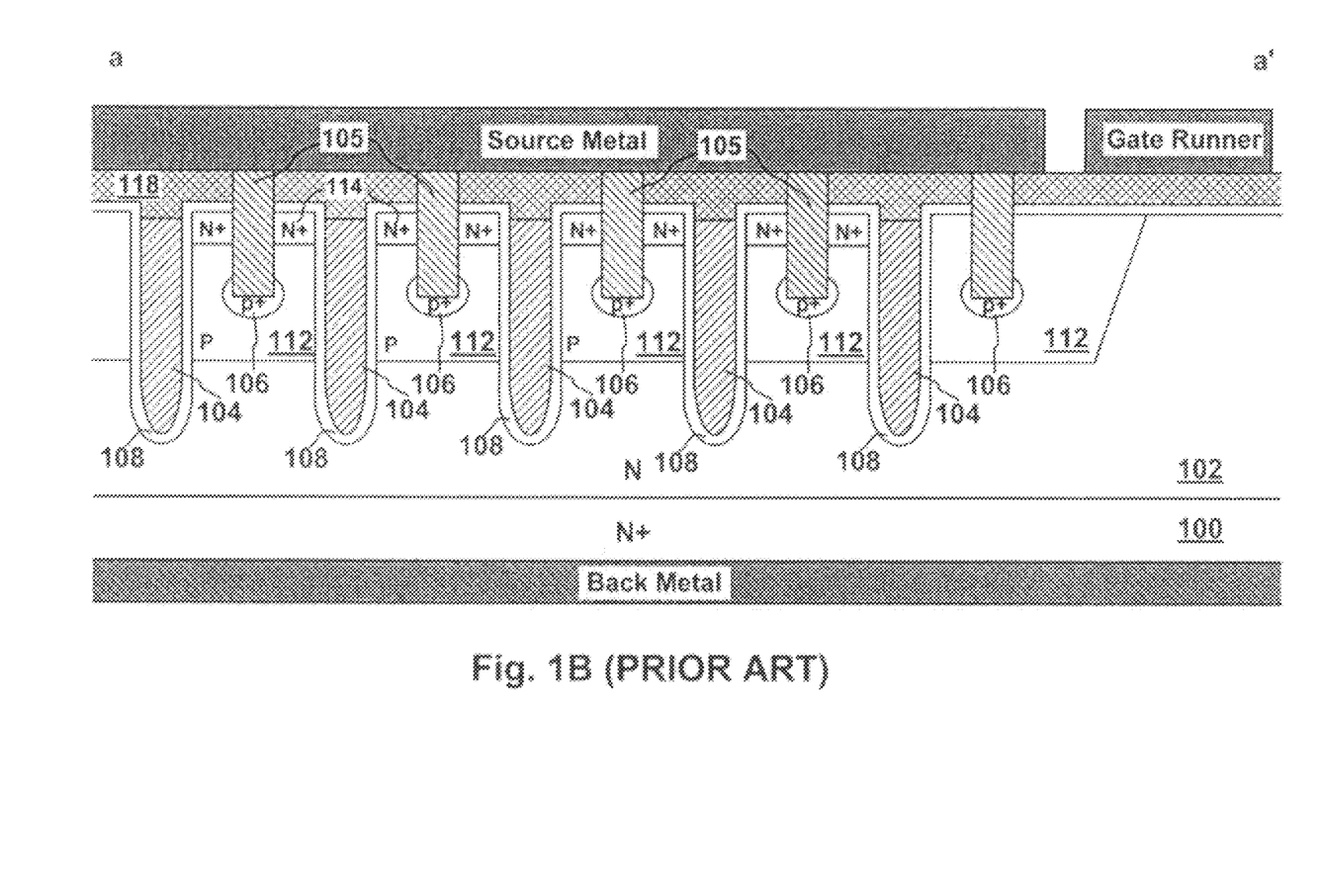
FIG. 1B is a side cross-sectional view of prior art along a-a' axis marked in FIG. 1A.

FIG. 1A shows the top view a trench MOSFET of prior art while FIG. 1B shows its a-a' cross section view. Refer to FIG. 1B, this device is formed on N+ substrate 100 on which an N doped epitaxial layer 102 is grown. A plurality of trenches are etched inside said epitaxial layer 102 and filled with doped poly within trenches to serve as trench gates 104 over the gate oxide layer 108. Between each trench, there is a P-body region 112 introduced by Ion Implantation, and an N+ source regions 114 near the top surface of said P-body region 112. P+ region 106 is introduced underneath the source-body contact trench 105 which located penetrating through contact oxide interlayer lrce regions 114 to contact with the source regions 114 and the body regions 112.

Figure 1C:
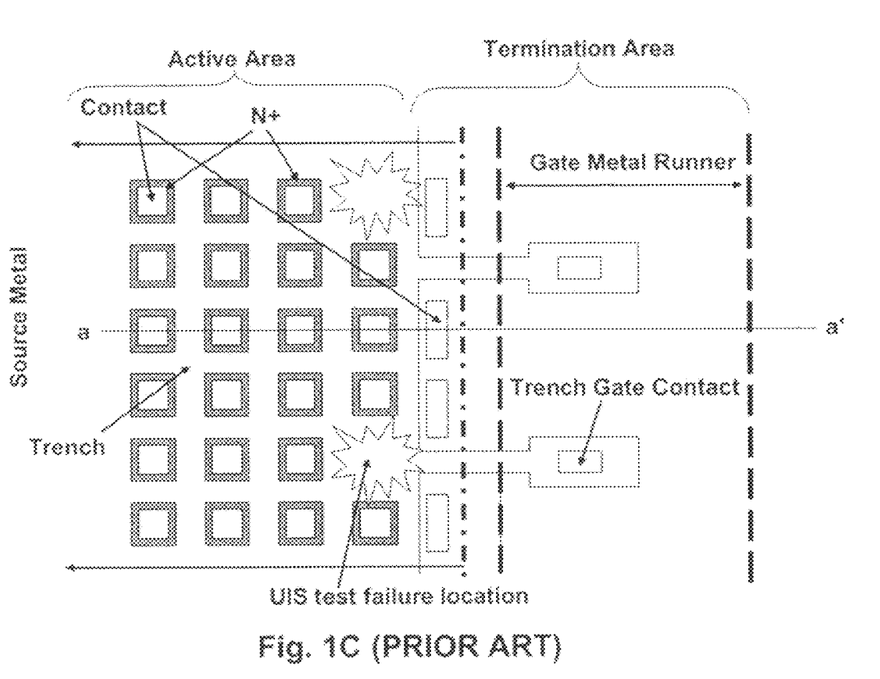
FIG. 1C indicates the failed location of prior art after UIS test.
Figure 2A:
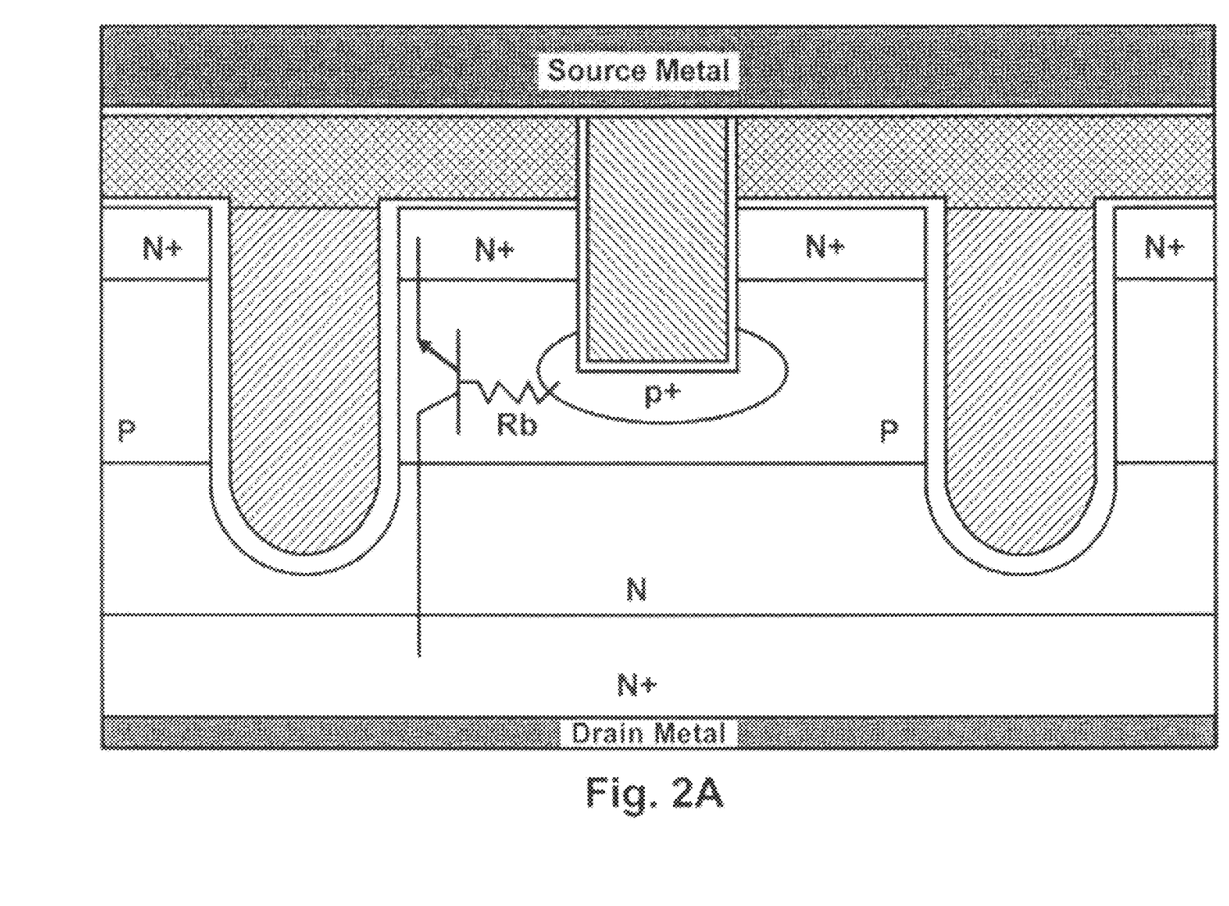
FIG. 2A is a side cross-sectional view of prior art showing the parasitic bipolar of MOSFET.
Figure 3:
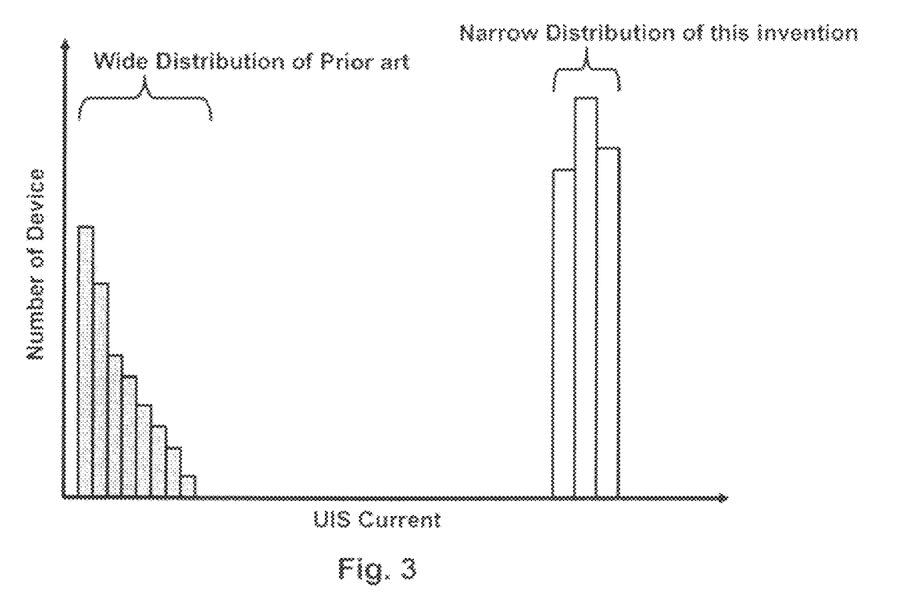
FIG. 3 is a profile showing the comparison of UIS current distribution between prior art and this invention.

As mentioned above, failed site always occur near edge of active area after UIS test, as shown in FIG. 1C, which is resulted from the turning on of a parasitic bipolar, as illustrated in FIG. 2A. Since the cells are most nearest gate metal pad and gate runner (refer to FIG. 1A), the gate of the cells near the active edge are turned on first when gate bias is increasing for turning on channel, resulting the parasitic bipolar turning on first near the active edge, thus weakening the avalanche capability of semiconductor device. Therefore, the measured UIS current at breakdown voltage is low and has wide distribution, as illustrated in FIG. 3.

Figure 2B:
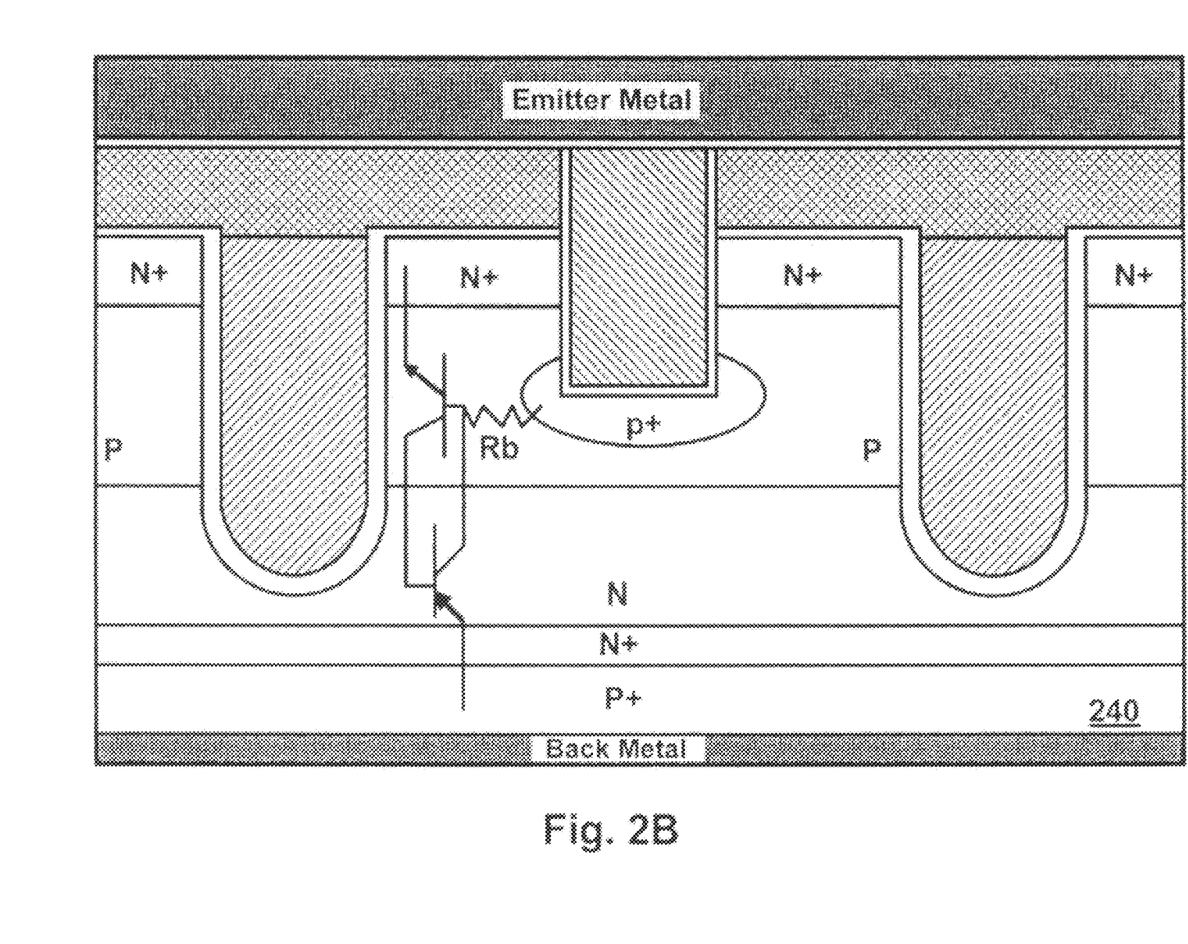
FIG. 2B is a side cross-sectional view of prior art showing the parasitic thyristor of IGBT.

Same technical difficulty also exists in conventional trench IGBT, as shown in FIG. 2B. Different from FIG. 2A the parasitic thyristor in trench IGBT is composed of an NPN and PNP bipolar as a result of the existence of P+ substrate 240.

Accordingly, it would be desirable to provide new and improved device configuration to enhance the avalanche capability of semiconductor devices.

SUMMARY OF THE INVENTION

It is therefore an object of the present invention to provide new and improve device configuration to solve the problem discussed above.

Figure 4:
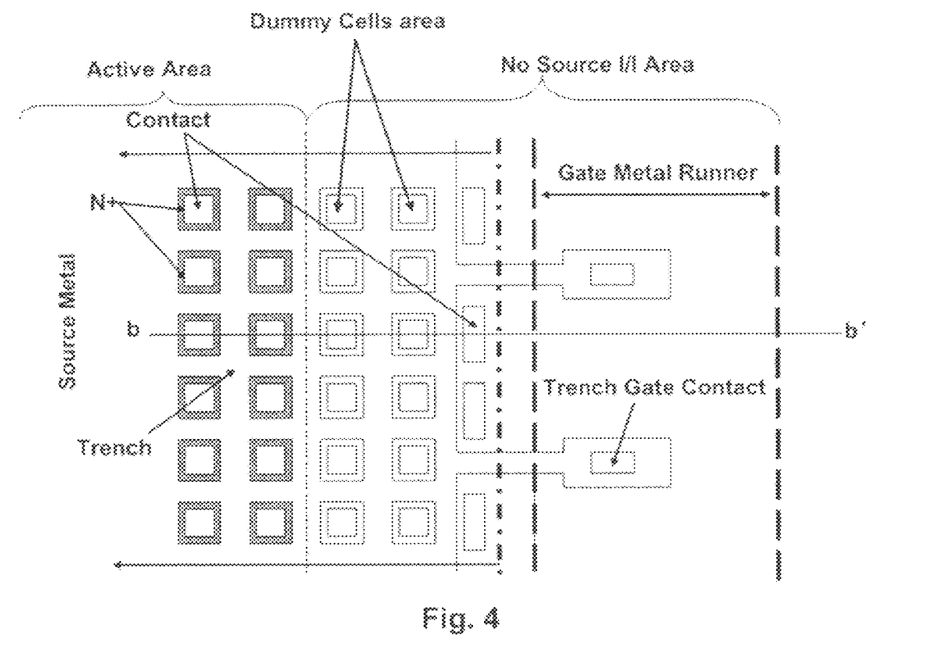
FIG. 4 is a top view of closed cell design of this invention.
Figure 5:
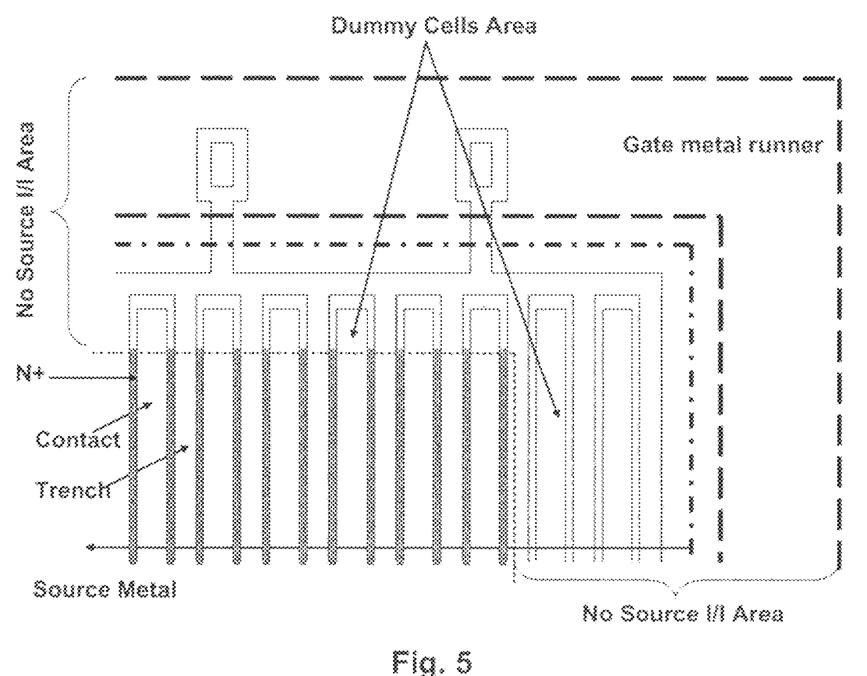
FIG. 5 is a top view of stripe cell design of this invention.

One advantage of the present invention is that, dummy cells composed of at least one cell along edge of active area without N+ source (or emitter region for trench IGBT) region are employed according to the present invention, please refer to FIG. 4 and FIG. 5 for top views of closed cell design and stripe cell design of this invention. Said dummy cells having no parasitic bipolar act as buffer cells to absorb avalanche energy at UIS test when gate bias is started to be increased. FIG. 3 shows comparison of UIS current distribution between prior art and the present invention, from which it can be concluded that the value of the UIS current of the present invention is obviously increased while having a distribution much narrower than the prior art.

Figure 10A:
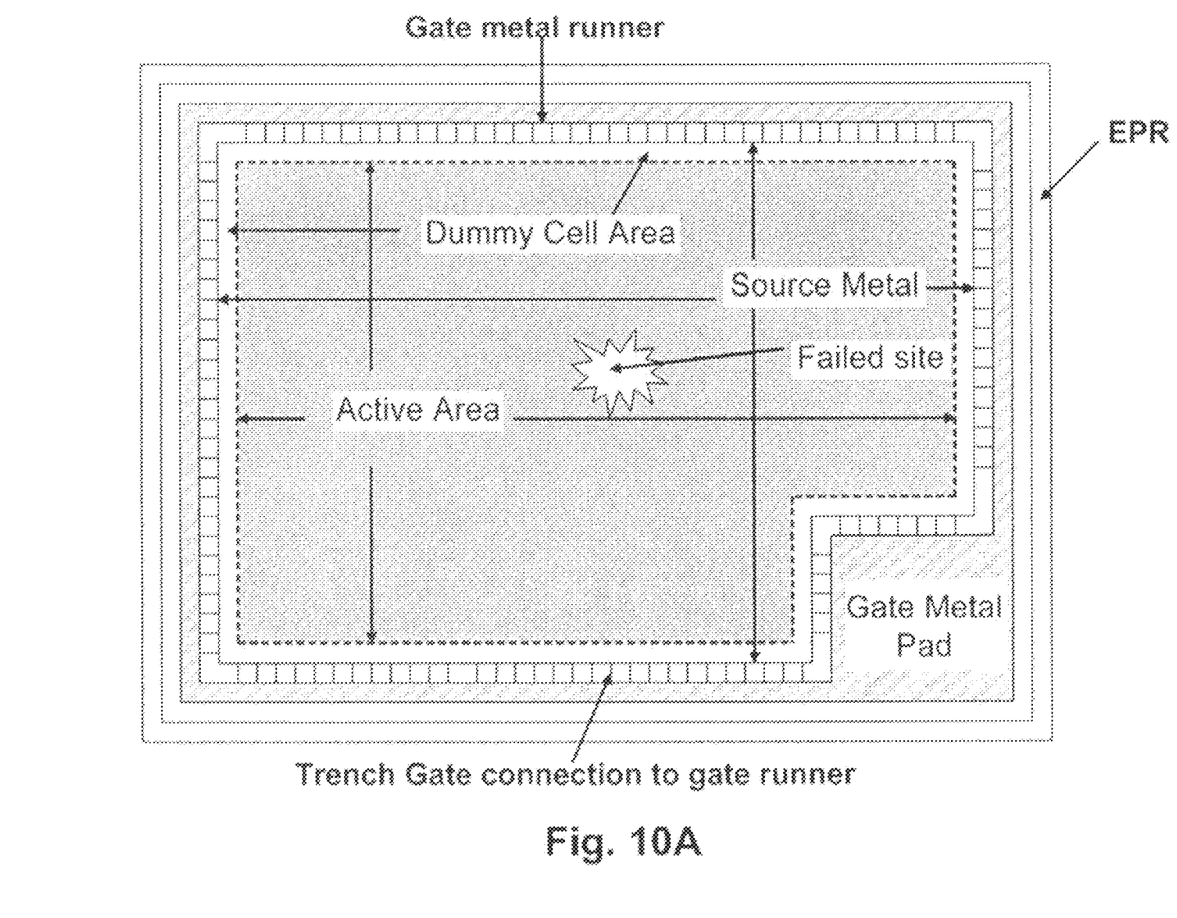
FIG. 10A is a top view of this invention with gate metal runner surrounding the whole device.

Another advantage of the present invention is that, the failed sites after UIS test in this invention become random distribution instead of always occurring near edge of active area, as shown in FIG. 10A, enhancing the avalanche capability of the new semiconductor device.

Figure 6:
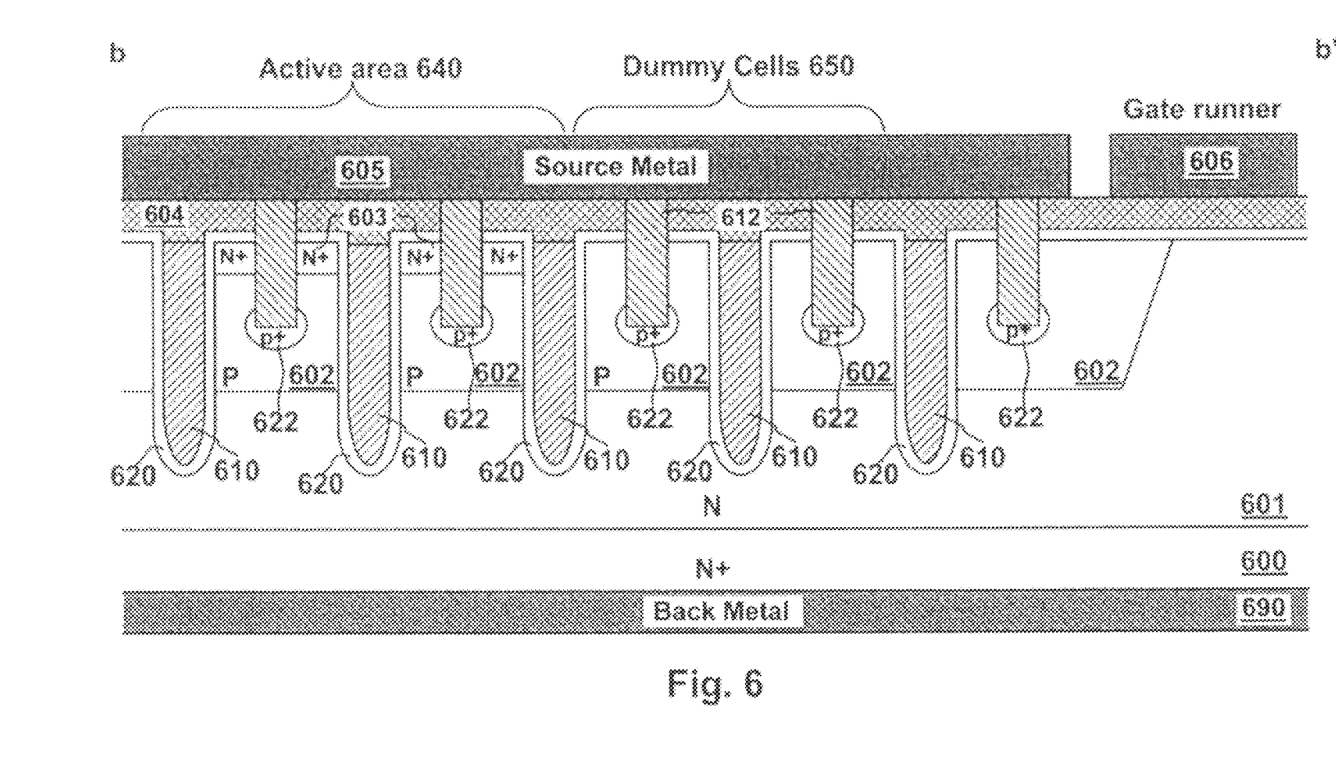
FIG. 6 is a side cross-sectional view of a trench MOSFET along b-b' axis marked in FIG. 4 according to the present invention.

Briefly, in a preferred embodiment according to the present invention, as shown in FIG. 6, which also shows the b-b' section view of a preferred embodiment of FIG. 4. The present invention disclosed a trench MOSFET device formed on a substrate heavily doped with a first semiconductor doping type, e.g., N+ doping type. Onto said substrate, grown an epitaxial layer lightly doped with the same semiconductor doping type as the substrate and a plurality of trenches were etched wherein doped poly was filled within a plurality of trenches to serve as trench gates over a gate oxide layer along the inner surface of said gate trenches. P-body regions are extending between every two gate trenches while N+ source regions formed on its top surface only within active area. Through a thick contact oxide interlayer deposited over epitaxial layer, source-body contact trenches are etched into epitaxial layer for source-body connection. Tungsten plugs acting as the contact metal are filled into the source-body contact trenches to connect said source regions and said body regions to source metal. Dummy cells without N+ source region composed of at least one cell is implemented along edge of active area, helping to enhance avalanche capability of the trench MOSFET device. In termination area, gate metal runner which also serving as metal field plate is formed overlying P body and top surface of epitaxial layer.

Figure 7:
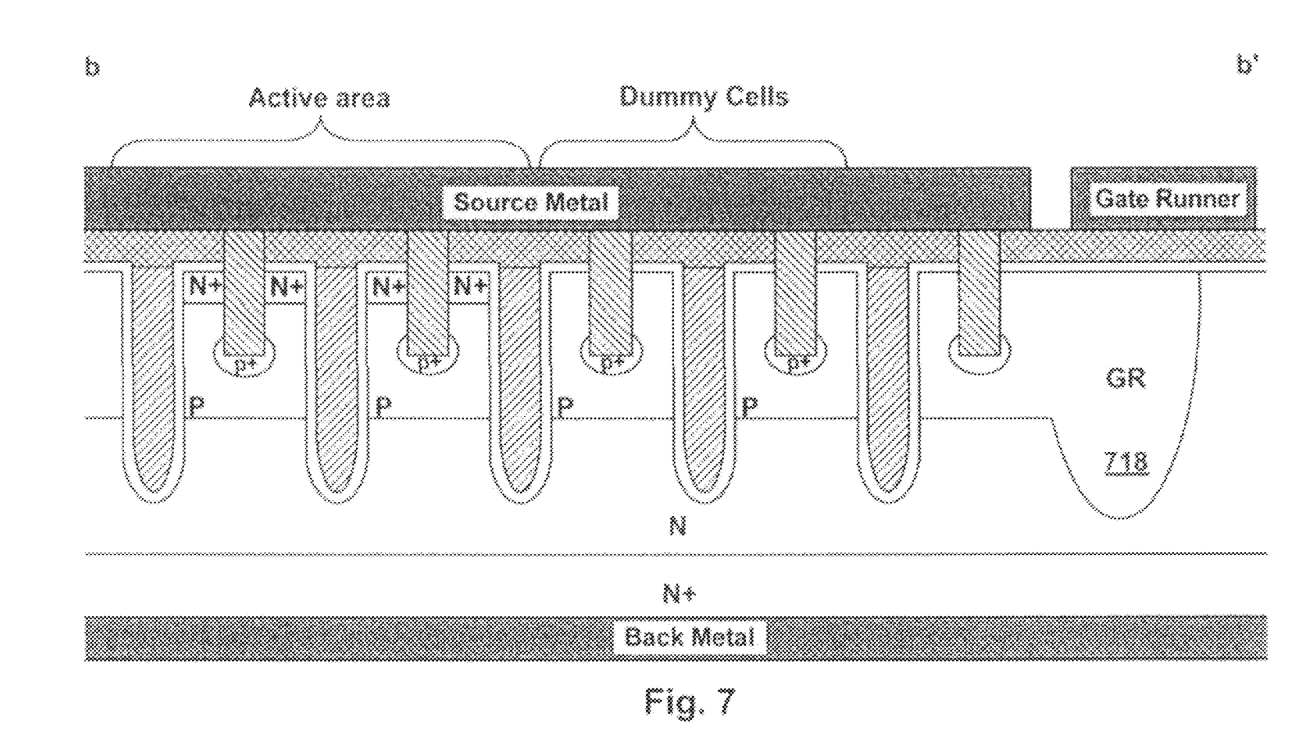
FIG. 7 is a side cross-sectional view of a trench MOSFET along b-b' axis marked in FIG. 4 according to the present invention.

Briefly, in another preferred embodiment according to the present invention, as shown in FIG. 7, which also shows the b-b' section view of another preferred embodiment of FIG. 4. The trench MOSFET structure disclosed is similar to the structure in FIG. 6 except that there is a deep guard ring under said gate metal runner in termination area.

Figure 8:
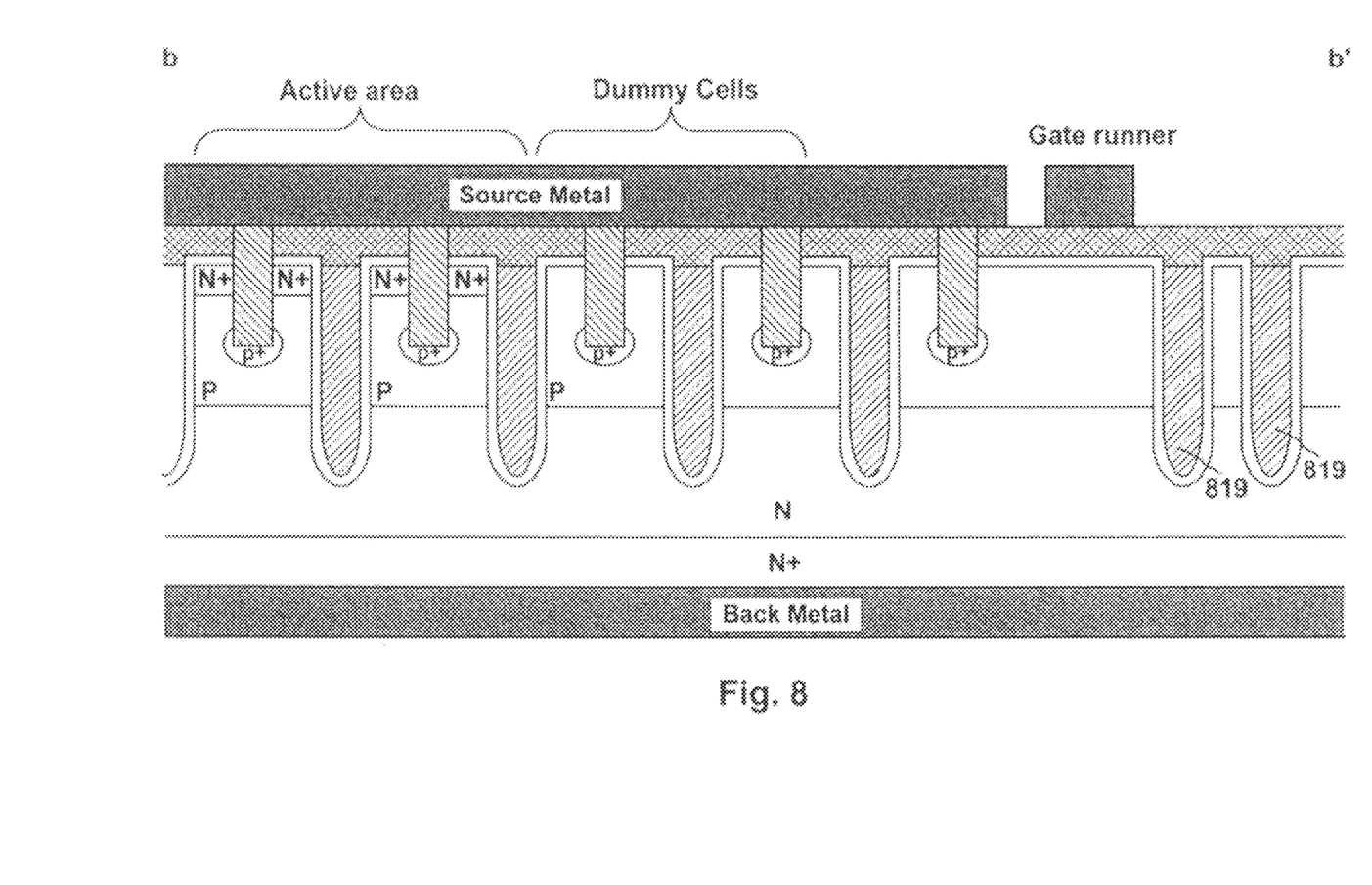
FIG. 8 is a side cross-sectional view of a trench MOSFET along b-b' axis marked in FIG. 4 according to the present invention.

Briefly, in another preferred embodiment according to the present invention, as shown in FIG. 8, which also shows the b-b' section view of another preferred embodiment of FIG. 4. The trench MOSFET structure disclosed is similar to the structure in FIG. 6 except that there are multiple trench floating rings to serve as termination.

Figure 9:
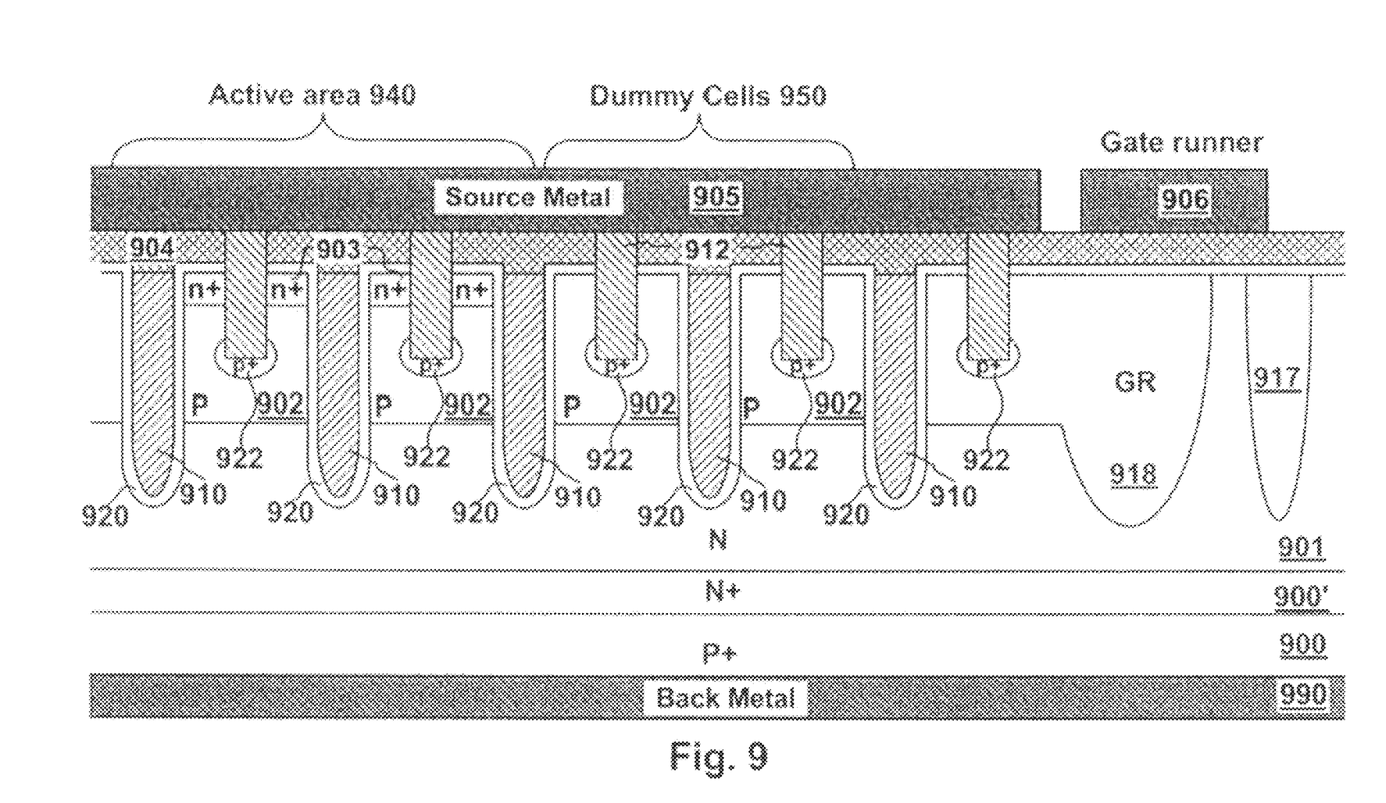
FIG. 9 is a side cross-sectional view of a trench IGBT according to the present invention.

Briefly, in another preferred embodiment according to the present invention, as shown in FIG. 9, the present invention disclosed a trench IGBT device formed on a substrate heavily doped with a second semiconductor doping type, e.g., P+ doping type. Onto said substrate, a heavily doped epitaxial layer and another lightly doped epitaxial layer are subsequently formed with the opposite doping type to the substrate. A plurality of trenches were etched within lightly doped epitaxial layer and filled with doped poly to serve as trench gates over a gate oxide layer along the inner surface of the gate trenches. P-body regions are extending between every two gate trenches with N+ emitter regions top its top surface only within active area. Through a thick contact oxide interlayer deposited over epitaxial layer, emitter-base contact trenches are etched into epitaxial layer for emitter-base connection. Tungsten plugs acting as the contact metal are filled into the emitter-base contact trenches to connect the emitter regions and the body regions to emitter metal. Dummy cells without N+ emitter region composed of at least one cell is implemented along edge of active area, helping to enhance avalanche capability of the trench IGBT device. In termination area, gate metal runner which also serving as metal field plate is formed over deep guard ring and multiple floating rings.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

Please refer to FIG. 6 for a preferred embodiment of this invention showing the b-b' cross section of FIG. 4 where an N-channel trench MOSFET with dummy cells at the edge of active area formed on a heavily N+ doped substrate 600 coated with back metal 690 on rear side as drain. Onto said substrate 600, a lightly N doped epitaxial layer 601 is grown, and a plurality of trenches is etched wherein. Doped poly is filled into the gate trenches padded with a gate insulation layer 620 formed over the inner surface of gate trenches to form trenched gates 610. P-body regions 602 are extending between every adjacent trench gates 610 with N+ source region 603 near the top surface only within active area 640. Trench source-body contacts filled with tungsten plug 612 are formed penetrating through a thick contact oxide interlayer 604 with contact p+ implantation area 622 around each the source-body contact bottom to contact source region 603 and P-body region 602 to source metal 605. Dummy cells 650 composed of at least one cell are implemented along edge of said active area 640 without N+ source region near top surface of P-body region 602. In termination area, gate metal runner 606 which also serving as metal field plate is deposited overlying P body 602 and top surface of epitaxial layer 601.

FIG. 7 shows another preferred embodiment of the present invention where the trench MOSFET disclosed has a similar structure to that in FIG. 6 except that there is a deep guard ring 718 under said gate metal runner in termination area.

FIG. 8 shows another preferred embodiment of the present invention where the trench MOSFET disclosed has a similar structure to that in FIG. 6 except that there are multiple trench floating rings 819 to serve as termination.

Please refer to FIG. 9 for another preferred embodiment of this invention where a trench IGBT with dummy cells at the edge of active area formed on a heavily P+ doped substrate 900 coated with back metal 990 on rear side. Onto said substrate 900, a heavily N+ doped epitaxial layer 900' and a lightly N doped epitaxial layer 901 is grown subsequently. A plurality of trenches are etched into the epitaxial layer 901 and filled with doped poly onto a gate insulation layer 920 formed over the inner surface of said trenches to form trenched gates 910. P-body region 902 are extending between every adjacent trench gates 910 with N+ emitter region 903 near the top surface only within active area 940. Trench emitter-base contacts filled with tungsten plug 912 are formed penetrating through a thick contact oxide interlayer 904 with contact p+ implantation area 922 around each the emitter-base contact bottom to contact emitter regions 903 and P-body region 902 to emitter metal 905. Dummy cells 950 composed of at least one cell are implemented along edge of the active area 940 without N+ emitter region. In termination area, gate metal runner 906 which also serving as metal field plate is deposited over deep guard rings 917 and 918.

FIG. 10A is top view of the inventive trench MOSFET showing locations of said dummy cells from which can be seen that different from prior art, the failed site here after UIS test is randomly located in active area, thus enhancing the avalanche capability.

Figure 10B:
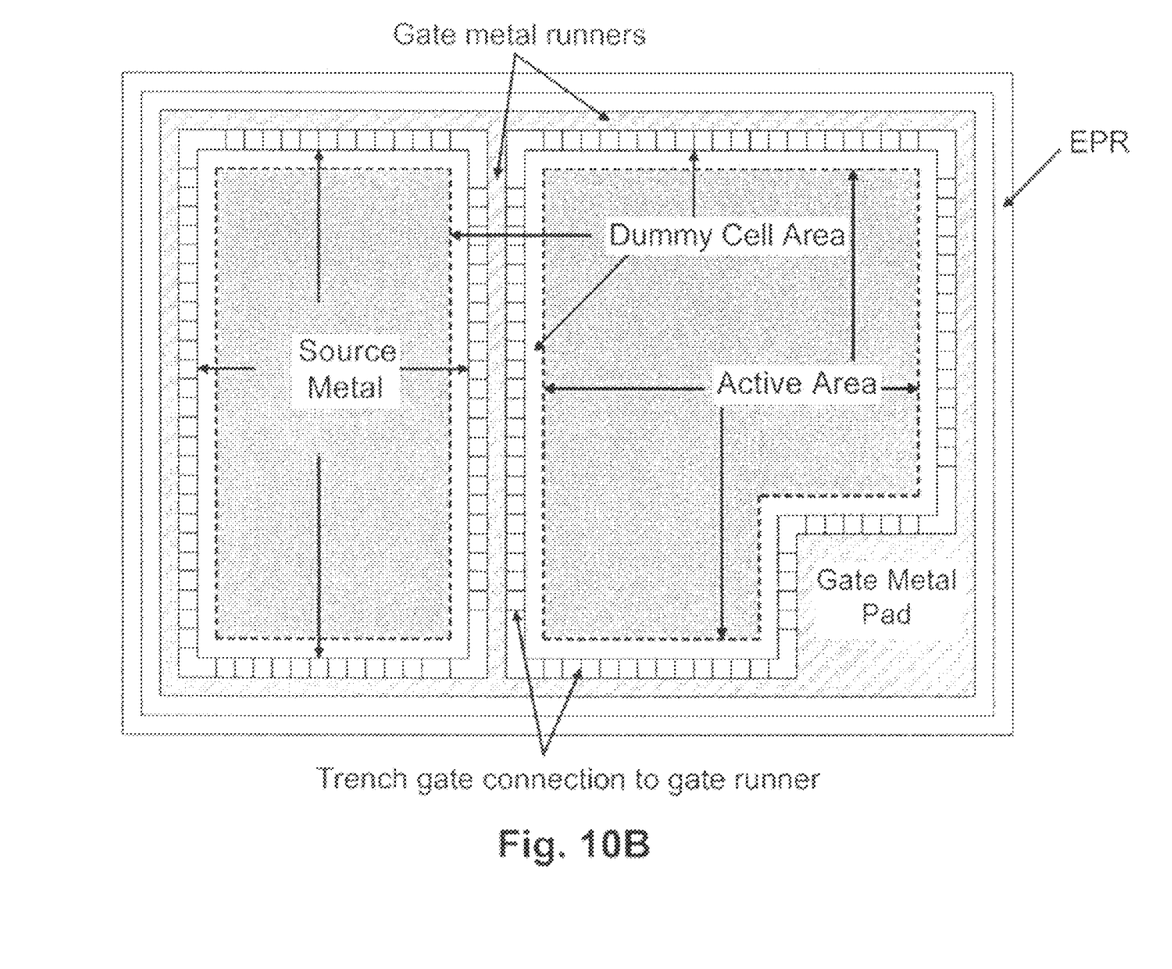
FIG. 10B is another top view of this invention with multiple gate runners for gate resistance reduction.

FIG. 10B is another top view of the inventive trench MOSFET showing locations of said dummy cells where multiple gate runners are employed for Rg (gate resistance) reduction.

Figure 10C:
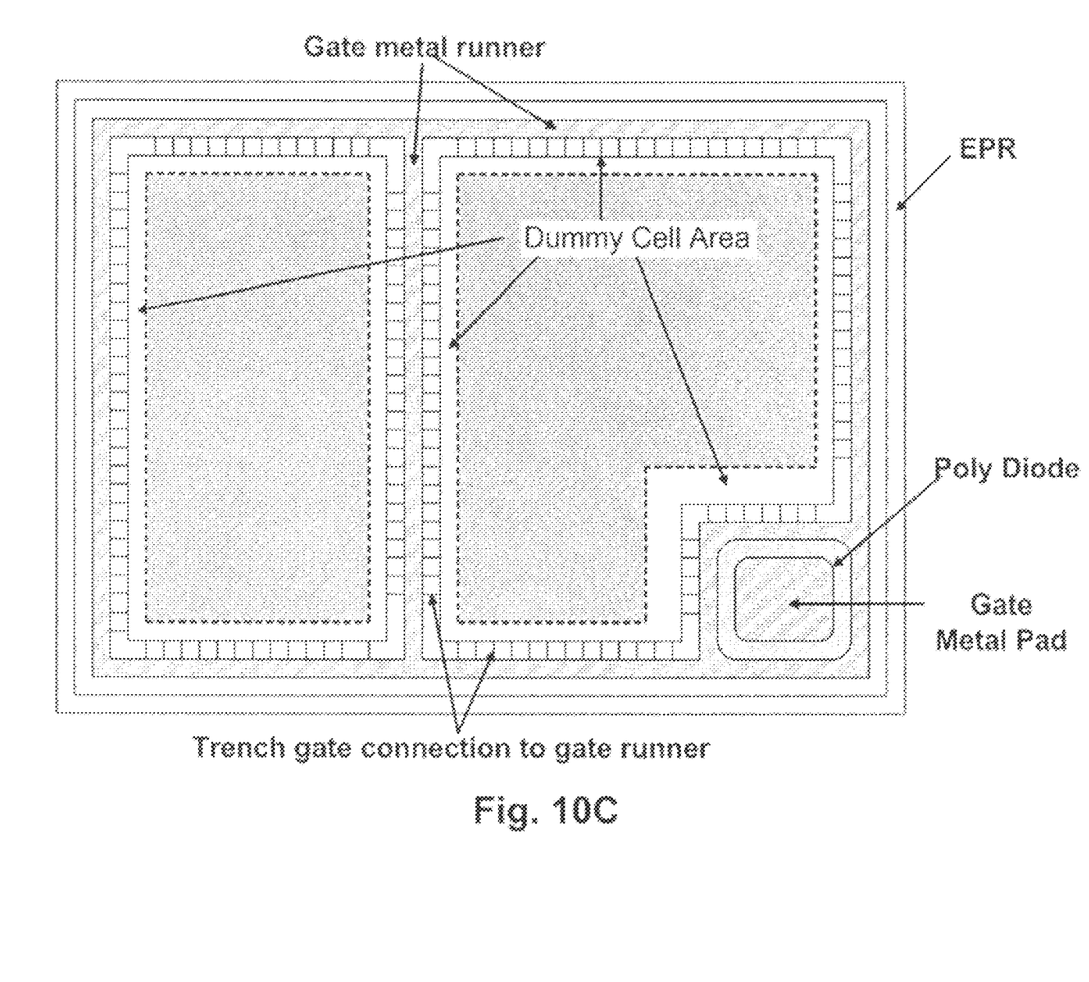
FIG. 10C is another top view of this invention with poly zener diode underneath gate metal pad.

FIG. 10C is another top view of the inventive trench MOSFET showing locations of said dummy cells where poly zener diode is employed underneath gate metal pad for ESD protection.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A vertical semiconductor power MOSFET device comprising a plurality of semiconductor power cells with each cell comprising a trenched gate surrounded by a source region with a first type conductivity in an active area encompassed in a body region with a second type conductivity above a drain region disposed on a bottom surface of a low-resistivity substrate with said first type conductivity, wherein said MOSFET cell further comprising:
   an epitaxial layer of said first type conductivity over said substrate, said epitaxial layer having a lower doping concentration than the substrate;
   a first insulating layer serving as a gate oxide lining the inner surface of openings for said trenched gates;

a second insulating layer functioning as a thick contact oxide interlayer covering top surface of the epitaxial layer;

a plurality of trench source-body contacts filled with tungsten plugs and opened through the second insulating layer and extending into the body region;

at least one dummy cell without said source region formed at the edge of said active area near by a gate metal pad and a gate metal runner;

a source metal layer connected to the source regions and the body regions via the trench source-body contacts;

a drain metal layer formed on a bottom surface of the substrate;

a gate metal layer served as said gate metal runner and connected to said gate metal pad for wire bonding, said gate metal runner also serving as a metal field plate deposited over a deep guard ring of said second type conductivity in a termination area.

2. The MOSFET of claim 1, wherein the MOSFET cells are designed to be closed cell structures.

3. The MOSFET of claim 1, wherein the MOSFET cells designed to be stripe cell structures.

4. The MOSFET of claim 1, wherein said gate metal pad is connected to single or multiple gate metal runners.

5. The MOSFET of claim 1, wherein a poly zener diode is formed underneath said gate metal pad.

* * * * *